United States Patent [19]
Bersin et al.

[11] Patent Number: 5,099,100
[45] Date of Patent: Mar. 24, 1992

[54] PLASMA ETCHING DEVICE AND PROCESS

[75] Inventors: Richard L. Bersin, Richmond; Michael J. Singleton, Union City, both of Calif.

[73] Assignee: Branson International Plasma Corporation, Hayward, Calif.

[21] Appl. No.: 415,453

[22] Filed: Sep. 29, 1989

Related U.S. Application Data

[63] Continuation of Ser. No. 856,249, Dec. 1, 1977, abandoned, which is a continuation of Ser. No. 569,493, Apr. 18, 1975, abandoned, and a continuation-in-part of Ser. No. 498,100, Aug. 16, 1974, Pat. No. 3,879,597.

[51] Int. Cl.⁵ ............................................. B23K 9/00
[52] U.S. Cl. ............................ 219/121.4; 219/121.43; 219/121.44; 156/345; 156/646; 204/298.31
[58] Field of Search .................... 219/121.43, 121.44, 219/121.4; 156/646, 345, 643; 204/298.31, 298.38

[56] References Cited

U.S. PATENT DOCUMENTS 3,485,591  12/1969  Evans et al. ..................... 23/293 R
4,028,155   6/1977  Jacob .............................. 156/643

Primary Examiner—Mark H. Paschall
Attorney, Agent, or Firm—Flehr, Hohbach, Test, Albritton & Herbert

[57] ABSTRACT

Plasma etching device and process in which a chamber is divided into two regions by a perforated screen. Objects to be etched are placed in one region, and a plasma is formed in the other region. Etching occurs in the first region, and structure is included for heating the etched objects in the first region to facilitate the removal of photoresist used to define the areas to be etched.

21 Claims, 1 Drawing Sheet

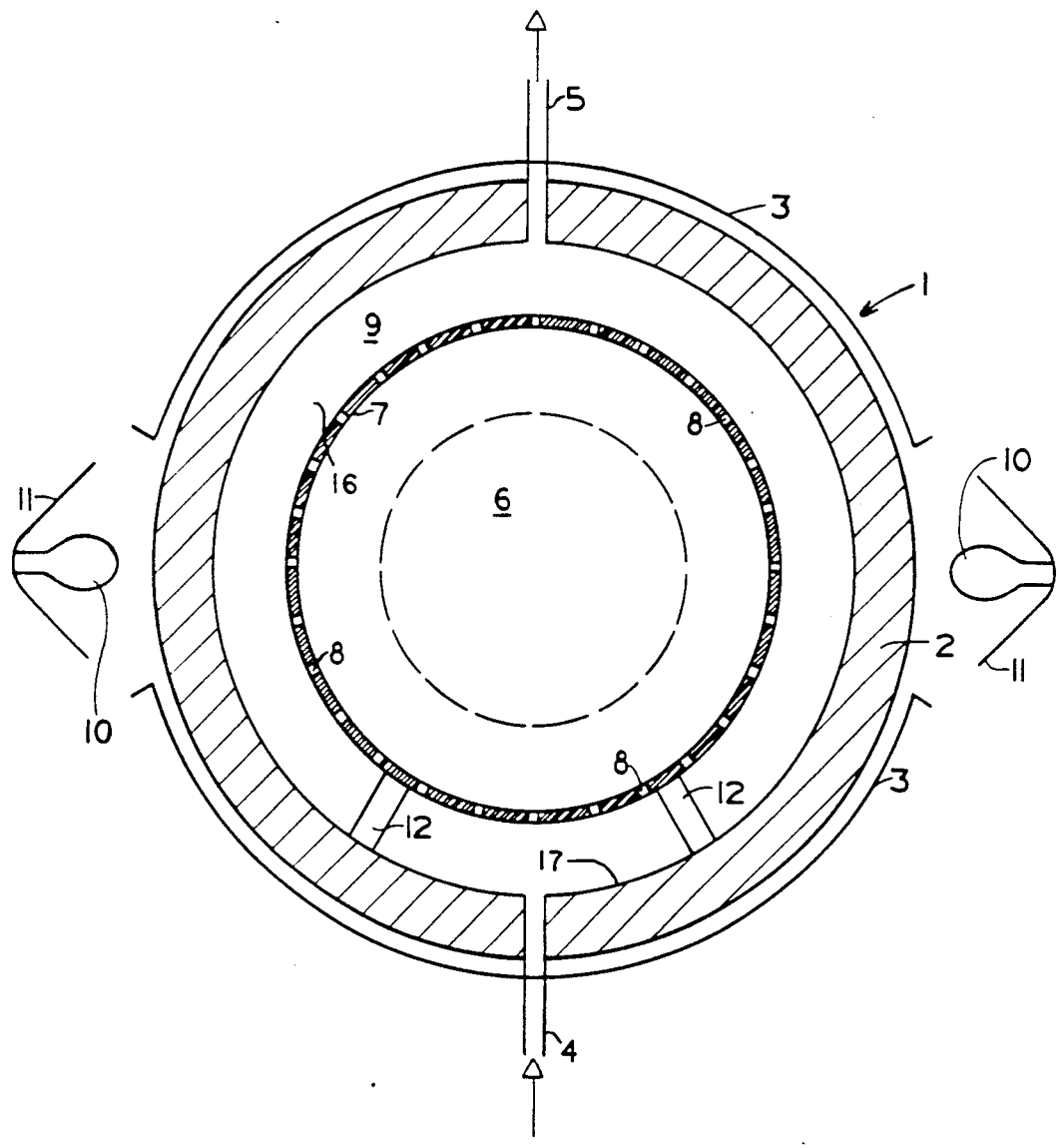

PLASMA ETCHING DEVICE AND PROCESS

CROSS-REFERENCE TO RELATED APPLICATION

This is a continuation. of application Ser. No. 856,249 filed Dec. 1, 1977 now abandoned, which is a continuation of application Ser. No. 569,493 filed Apr. 18, 1975 now abandoned, and a continuation-in-part of Ser. No. 498,100 filed Aug. 16, 1974, now U.S. Pat. No. 3,879,597.

BACKGROUND OF THE INVENTION

Etching surfaces of materials has long been a useful process. It is accomplished by coating all portions of the surface except those to be etched with a material that resists attack by the etchant, and then subjecting the entire article to contact with the etchant. After the surface has been etched sufficiently, it is removed from contact with the etchant; and the resistant material is then removed to produce a surface that is partially unetched. Resistant materials are called resists. When difficult patterns are to be etched, a photoresist is used. By conventional photographic techniques, the photoresist can be removed in intricate patterns with high resolution. Etching surfaces with intricate patterns having high resolution has become an important industrial process for producing small electronic components which are known as chips.

One process for producing chips involves etching of silicon wafers by placing a resist on their surface with photographic techniques and then subjecting the silicon to a plasma. Plasma is made by subjecting gas at low pressure to radio frequency voltage. Etching is accomplished by placing the gas at low pressure in a quartz cylinder surrounded by a source of radio frequency power, such as a coil or a number of electrodes, and then energizing the coil or electrode with high voltage at radio frequency. The production of a plasma is indicated by a bright glow within the quartz cylinder.

Plasmas contain highly active but difficult-to-identify species. For example, a plasma of a very inert gas such as a fluorocarbon, known commercially as Freon, will etch glass, indicating that an active fluorine species is present in the plasma. In addition to the active chemical species, there are strong radiations, such as ultraviolet, and strong ion and electron bombardment of the surfaces within the plasma. The radiation and the bombardment produces some unwanted effects. For example, radiation causes heat, which in turn causes the photoresist to be attacked by the plasma. Ion bombardment causes the photoresist to be toughened so that subsequent removal, either by physical or chemical means is difficult.

The attack on the photoresist also limits the duration of a plasma etching process, and accordingly it limits the thickness of the material that may be removed. Using thicker layers of resist only partly solves the problem because the attack is most pronounced at the edge of the resist. Thus, a thick layer of resist may prevent etching of the major portion of the protected surface, but long term etching processes cannot successfully produce patterns with high resolution. Accordingly, it is important to etch quickly or, alternatively, to etch by a process that doesn't destroy any resist. Commercially it is always important to etch quickly in order to increase the productivity of a given device.

Another important consideration in an etching process is the uniformity of the surface that is etched. In a typical etching process, a group of wafers of the material to be etched are spaced closely from each other and positioned concentrically in a cylindrical etching chamber, with the surfaces of the wafers perpendicular to the axis of the chamber. The wafers are then subjected to plasma. The etching process begins at the edges of the wafers and proceeds toward the centers, and in almost all cases the edges of the wafers are etched more deeply than the center. In addition, the photoresist is most strongly attacked at the edges so that undercutting and poor resolution are more pronounced toward toward the edges than toward the centers. Uniformity of etching across a wafer is important, and it usually is obtained by using slower etching rates which cause less attack on the resist, and by using greater spacing between the wafers. Both of these measures reduce the productivity of a given device; and even when those measures are taken, uniformity is rare and its absence is simply endured.

SUMMARY OF THE INVENTION

This invention either overcomes or greatly mitigates the above enumerated problems. This invention includes a device for etching with plasma which is made in the usual way, including a cylinder made of a material such as quartz and having a rear wall and a front opening. The front opening is provided with a seal to permit evacuating the cylinder to very low pressures, and the cylinder is connected to an evacuation system and to a source of gas from which plasma is to be made.

The cylinder is provided with a suitable electrical system for generating a plasma, such as a group of electrodes or a coil connected to a source of radio frequency power.

In accordance with this invention, a perforated cylinder of an electrically and thermally conductive material is maintained within the cylinder constituting the chamber in which the plasma is generated. The perforated cylinder preferably is aluminum, and it is spaced from the wall of the outer cyliner.

The operation of the device of this invention includes placing the material to be etched within the perforated cylinder, evacuating the device in the usual way, bleeding the plasma gas into the device in the usual way, and applying high voltage radio frequency in the usual way. The result of the process, however is very unusual and unexpected. First, it is observed that the glowing material that usually fills the entire plasma chamber is confined to the space between the perforated cylinder and the cylinder. The volume within the perforated cylinder is a dark tunnel.

The etching process proceeds in the dark tunnel at the usual rate, but the photoresist is not attacked at all. When measures are taken to increase the etching rate, such as increasing the power that is used or increasing the pressure of the etchant gas, the rate of etching increases correspondingly, but the photoresist still remains virtually unattacked. Using the present invention, it has been found that etching times can be halved without discernible attack on resist. This invention also permits the use of plasma etching where it was not previously possible: specifically, to etch materials that are so thick or so resistant to etching that a photoresist could not endure through an etching process that is long enough or intense enough to remove the same amount of material employing prior art devices. Also, surprisingly, in the device of this invention a high degree of uniformity across the surface of wafers being etched is obtained, even though those wafers are closely spaced.

The perforated cylinder of this invention is preferably fabricated of a material which is both thermally and electrically conductive, such as aluminum, copper, silver, or like metals. Aluminum is particulary suitable because it is chemically inert to fluorine-containing plasmas and is inexpensive and readily available. In some applications, however, electrically insulative materials such as quartz can be used. The perforation may be relatively large. For example, an aluminum house screen bent into a cylinder is adequate. It is preferred for structural reasons that the perforated metal cylinder be a light gauge sheet that is punched with evenly and closely spaced holes. Holes about ⅛ inch in diameter, spaced about ⅜ inch on centers, have been found to be adequate.

Although it is not known, it is thought that the perforated cylinder in the device of this invention acts as a screen for radiations, electrons, ions, and high temperatures; while it is entirely pervious to the active chemical species that cause etching. Temperature remains substantially uniform throughout the region within the cylinder, and this is believed to be an important factor in the uniformity of etching across a surface provided by the invention. The toughening of the photoresist that is so prevalent in conventional plasma etching processes is absent in the process effected in the device of this invention. In addition, it is observed that the photoresist withstands even pure oxygen plasma in the device of this invention unless the wafers are heated, for example, by an infrared lamp, or if the system is operated under conditions of high power and low pressure which allow the oxygen plasma to diffuse into the tunnel region. When the wafers are heated from an external source, the resist is quickly removed by even small quantities of oxygen in the plasma. It is accordingly an embodiment of this invention to provide an external heat source to the interior of the perforated cylinder. The word external is used in the sense that it is not caused by generating of plasma or radiation resulting from it.

BRIEF DESCRIPTION OF THE DRAWING

The drawing is a schematic representation in a cross section of an elevation view of a device embodying the invention.

DETAILED DESCRIPTION

The device, which is generally designated 1, includes a cylinder chamber 2 which is preferably made of an inorganic material such as quartz. Surrounding the chamber 2 are electrodes 3 which may either by a single coil, several coils or a number of capacitive electrodes. The electrodes 3 are connected to a source of electrical energy at radion frequencies and in any suitable circuit known to the art. The cylindrical chamber 2 is also provided with a gas inlet 4 and a gas outlet 5, which is connected to suitable equipment for evacuating the chamber 2. A cylinder 7 of an electrically and thermally conductive material such as aluminum is maintained within the chamber 2. The cylinder 7 contains perforations 8 and is supported preferably by legs 12, to occupy a position coaxial with the chamber 2. Conventional means, not shown, are employed within the cylinder 7 to maintain material to be etched—shown as 6 in broken line representation. The material to be etched does not form part of this invention and is illustrated only to show positional relationships. Conventional racks are employed for holding the material to be etched, which is usually in the form of the wafers, spaced from one another, upright and coaxial with the chamber 2.

As indicated above, cylinder 7 is preferably fabricated of a material which is both thermally and electrically conductive, such as aluminum, copper, silver, or like matals. In some applications, however, electrically insulative materials such as quartz can be used. In this context, the term thermally conductive is used to designate a perforated cylinder which has a small thermal resistance compared to the thermal resistance of the volume of plasma displaced by the cylinder. It is preferable that the temperature of the perforated cylinder remain substantially uniform throughout the cylinder even though the temperature of the plasma outside the cylinder may not be uniform. With the cylinder at a constant temperature and in the absence of power dissipation within the cylinder, there are no temperature gradiants within the cylinder.

The term electrically conductive is used to designate a perforated cylinder having an electrical resistance which is small compared to the electrical resistance of the volume of plasma within the cylinder. With a cylinder of lower resistance than the plasma, any currents produced by voltages across the cylinder will flow through the cylinder rather than in the plasma. Consequently, substantially no power is dissipated in the plasma within the cylinder.

It has also been observed that it is preferable to make the surface area of the perforated cylinder as small as possible when the cylinder is fabricated of materials such as aluminum which act as agents which recombine atomic oxygen. The recombination reduces the concentration of atomic oxygen within the cylinder, and this increases the time required to strip photoresist from wafers processed in the device. In order to make the surface area small, the perforations are preferably made as large as possible while maintaining the desired thermal and electrical conductivity of the cylinder.

A praticularly beneficial embodiment of this invention employs an external heat source illustrated as an infrared lamp 10 with a reflector 11 that is positioned to supply heat by radiation to the wafer 6, so that stripping a photoresist may be effected after etching is completed without dismantling the apparatus. The remaining portions of the apparatus are all conventional, and they include a rear wall 16 and a sealable front opening 17 so that the chamber 2 may be evacuated. It is essential that space 9 be maintained between the chamber 2 and the perforated cylinder 7 because the active species that effect etching are generated in this annular space.

In general, the device of this invention is employed by positioning one or more wafers 6 in a suitable rack and then placing the rack within the cylinder 7 so that it is evenly spaced between the front and rear walls of the chamber 2 and approximately coaxial with the chamber 2. The wafers to be etched will normally be spaced about 3/16 inch apart and standing approximately vertically. When the wafers are positioned within the chamber 2, the front opening is closed and the chamber 2 is evacuated to very low pressures. It is generally desirable to bleed some of the plasma-producing gas into the chamber and to evacuate it again so that, by dilution, air is removed almost completely. When a suitable atmosphere is obtained within the chamber 2, the pressure is adjusted, perferably by the maintainance of a dynamic pressure that is maintained by bleeding a small amount of gas into the chamber via line 4 while evacuating the gas from the chamber via line 5, after which radio frequency voltage at suitable power is applied to the electrodes 3.

When electric power is supplied to electrodes 3, a brilliant glow appears in the annular space 9. However, the interior of the cylinder 7 remains dark. The glow in annular space 9 indicates that plasma is being generated as well as ions, electrons, and radiations; and the generation of plasma is continued until sufficient etching has been accomplished on the wafer 6. At that point, the etching process is completed and the wafers may be removed from the interior of cylinder 7. If the wafers are removed at this point in the process, it is necessary to treat them to remove photoresist.

A particularly beneficial embodiment of this invention is involved wherein, when etching is completed, the wafers 6 are heated by radiations from infrared lamps 10. Since most etching processes evolve oxygen and since most etching gases include some oxygen, the heated wafer quickly responds to the oxygen-containing plasma; and the resist oxidizes and is removed cleanly and completely from the wafer in a very short time. When insufficient oxygen is present in the plasma to effect removal of the resist, additional quantities of oxygen may be bled in through line 4 for the rapidly-effected process of oxidizing the resist. When this embodiment is employed, the wafers are complete when removed from the plasma-treating zone.

A number of tests were performed to demonstrate the present invention, which are set forth in the following examples.

EXAMPLE 1

A number of 2 inch diameter wafers of phosphorus-doped glass were prepared with patterns of photoresist 5000 angstrom units thick. In all cases the etching process was effected to remove phosphorus glass to a depth of 5000 angstrom units. The wafers were placed in an 8 inch diameter chamber which was evacuated and operated as described above, employing a gas consisting of tetrafluoro methane containing 4% v oxygen. The same chamber was used in all tests; however, in those tests designated "tunnel" a perforated aluminum cylinder was employed in accordance with this invention, while in those tests designated "open chamber" no perforated aluminum cylinder was employed. Open chamber tests employ plasma-generating apparatus of the prior art.

Since attack on the silicon wafer by the plasma generates heat which in turn quickly destroys the photoresist, some of the wafers employed in the open chamber were backed with an aluminum plate to shield the wafers from the plasma on the backside, and some wafers were in unbacked condition. All of the wafers in the tunnel were in unbacked condition. Table I sets forth the conditions and results obtained employing single wafers in the apparatus.

TABLE I

| | Open Chamber | | Tunnel |
| --- | --- | --- | --- |
| | Backed | Unbacked | Unbacked |
| Pressure (torr) | 0.1 | 0.1 | 0.5 |
| Power (watts) | 100 | 100 | 150 |
| Time (minutes) | 40 | 15 | 9 |
| Product | Acceptable | Not Acceptable | Excellent |

It is evident from the data in Table I that the present invention is superior to the prior art processes and devices in several respects. The device of this invention may be operated at substantially higher pressures than prior art devices, and it is therefore easier to operate and less time consuming in that high degrees of evacuation are not necessary. The present device also may tolerate higher power which saves time. The etching was effected in the device of this invention in 9 minutes without a backing, whereas it was effected in 40 minutes with a backed wafer in the open chamber. The unbacked wafer in the open chamber had its photoresist destroyed to such an extent that an unacceptable product resulted. In addition to saving time by employing an easier process to effect, the product obtained was an excellent product in that all of the photoresist was intact; no damage could be seen, and resolution was extremely high. Even the backed wafers in the open chamber showed attack by the plasma so that photoresist near the edges was removed. A great deal of manual effort is required to apply a backing to a wafer.

When the same test was effected in a 6 inch diameter chamber, exactly the same result was obtained in the tunnel; whereas no acceptable product could be obtained from the open chamber.

EXAMPLE 2

The same etching process, employing wafers of the same material and covered with the same photoresist, was effected, but in all cases the chamber was loaded with 25 wafers which were 2 inches in diameter and spaced 3/16 inch apart. The Table II below contains the results obtained.

TABLE II

| | Open Chamber | | Tunnel |
| --- | --- | --- | --- |
| | Backed | Unbacked | Unbacked |
| Pressure (torr) | 0.1 | 0.1 | 0.5 |
| Power (watts) | 100 | 100 | 150 |
| Time (minutes) | 80 | *— | 29 |
| Product | Acceptable | Not Acceptable | Excellent |

*Photoresist gone in 7 minutes

The time for etching of the unbacked wafers could not be obtained because within 7 minutes all of the photoresist had been destroyed and sufficient etching had not yet been accomplished. The same test was made in a 6 inch diameter chamber in which approximately the same results were obtained in the tunnel, while no acceptable product could be obtained in the open chamber.

EXAMPLE 3

In Example 3, and 8 inch diameter chamber was employed to etch 5000 angstrom units of phorphorus-doped glass masked with 5000 angstrom units of photoresist. Unbacked wafers 2 inches in diameter were employed and the etching process was operated at 150 watts of power and 0.5 torr pressure. Perforated aluminum cylinders in the form of cylindrical screens were employed as the perforated metal cylinder. Cylinders of different diameters were employed, and the results of a series of tests are set forth in Table III below.

TABLE III

| Cylinder Diameter (inches) | Etching Time (minutes) | Product |
| --- | --- | --- |
| 7 | 21 | Excellent |
| 6 | 16 | Excellent |
| 5 | 9.5 | Excellent |

TABLE III-continued

| Cylinder Diameter (inches) | Etching Time (minutes) | Product |
|---|---|---|
| 4 | 7.5 | Adequate |
| 3 | 4.5 | Not adequate |

The data in Table III suggests that the active species that effect etching are generated in the annular space 9 and pass through perforations 8 so that the wafers being etched are exposed to those active species. However, the perforated cylinder 7 apparently screens those elements of the plasma which cause heat, which in turn makes the photoresist susceptible to destruction by the plasma. The perforated cylinder 7 also apparently screens those radiations and materials that are not productive of etching but rather produce destructive effects on the photoresist. Thus, with a large diameter perforated cylinder, longer etching times are necessary because, apparently, active species must diffuse farther to contact the material being etched. However, when perforated cylinders too small in diameter are employed, some of the destructive materials in the plasma contact the material being etched. The data in Table III indicate that the spacing between the perforated cylinder and the specimen being etched is an important consideration for any given gas pressure and power; and the data indicate that a spacing in excess of one inch between all portions of the specimen being etched and the perforated cylinder is adequate for all ordinary plasma materials and power levels. No differences could be seen between the product within the 5 inch diameter cylinder and the product within the 7 inch diameter cylinder.

In general, in employing the device of this invention, lower pressures within the plasma-generating chamber tend to increase the penetration within the perforated cylinder of undesirable species that cause bad effects. Since higher pressures increase etching rate and are easier to maintain, the device of this invention is found to function better at more desirable operating conditions, which is opposite to the devices of the prior art wherein higher plasma gas pressures have higher rates of destruction of the resist.

As in the prior art, increased power increases the rate at which the resist is destroyed in the device of this invention. However, in prior art devices there appears to be a linear relationship between power and resist destruction rate; whereas in the device of this invention, increased powers do not increase the rate of resist destruction correspondingly, but rather to a small degree, until "breakthrough" power is attained.

Other generalities are that in all cases the use of a perforated, electrically conductive metal cylinder within the plasma chamber has a beneficial effect on the process of etching without destroying the resist. Specifically, the use of a perforated metal cylinder will always permit higher etching rates than without, in a given plasma system. However, if the spacing between the material being etched and the perforated metal cylinder is too close, this beneficial effect will be diminished.

In addition to the experiments reported in the examples, a number of experiments were performed in the device of this invention which accomplished what could not be accomplished in prior art devices under any circumstances. In one such experiment, a layer of 6000 angstrom units of thermal silicon oxide was etched from a specimen which was protected with a layer of resist 6000 angstrom units thick. Since the thermal oxide is so difficult to etch, in devices of the prior art this process could not be accomplished. However, employing the perforated metal cylinder of the device of this invention, it was accomplished in about 60 minutes; and after the etching was completed, the photoresist was found to be in excellent condition. In fact, resolution was such that lines one micron wide were etched in the oxide.

In another experiment 25 wafers 3 inches in diameter and having a surface of phorphorus-doped glass were etched through 6000 angstrom units of glass employing a thickness of only 6000 angstrom units of photoresist. Again, the photoresist was in excellent condition and produced a product with high resolution in less than 40 minutes. The same experiment performed with 2 inch diameter wafers produced the same result in less than 30 minutes.

Silicon nitride specimens were etched through 2000 angstrom units of silicon nitride in less than 5 minutes with absolutely no attack on the photoresist.

Although this invention is described with reference to a process for etching, it is applicable to other processes where surfaces are treated with active chemical species produced in plasma. Known treatments of plastics, metals, or other materials to produce desirable surface characteristics may be accomplished more rapidly and without unwanted side effects when these treatments are effected in the device of this invention.

What is claimed is:

1. In a plasma etching device: a housing defining a chamber having a first region of sufficient size to receive material to be etched and a second region separate from the first region, means for introducing an etching gas into the chamber, means for exciting the gas in the second region to produce a plasma of said gas, and means including a perforated member separating the first and second regions for confining the glow discharge of the plasma to the second region and permitting active species of the plasma to pass from the second region to the first region to effect etching of the material in the first region.

2. The plasma etching device of claim 1 wherein the perforated member is thermally conductive.

3. The plasma etching device of claim 1 wherein the perforated member is electrically conductive.

4. The plasma etching device of claim 1 wherein the perforated member is of aluminum.

5. The plasma etching device of claim 1 wherein the perforated member surrounds the first region.

6. The plasma etching device of claim 1 wherein the housing and perforated member are generally cylindrical and the perforated member is disposed coaxially of the housing.

7. In a plasma etching process utilizing a chamber divided into first and second regions by a perforated member, the steps of: introducing material to be etched into the first region, introducing an etching gas into the chamber, exciting the gas to form a plasma in the second region, and confining the glow discharge of the plasma to the second region while permitting active species of the plasma to pass through the perforated member to effect etching of the material in the first region.

8. The process of claim 7 together with the additional step of heating the material in the first region.

9. A plasma etching device comprising: a cylinder having an end wall and an opposing front opening, at least one electrode surrounding said cylinder and connected to a source of radio frequency energy; a perforated cylinder of electrically conductive metal within, concentric to, and spaced from the wall of said cylinder; said perforated metal cylinder being large enough in diameter to contain within it the material to be etched and serving to isolate the material from the glow discharge of the plasma to pass to the material to effect etching of the same.

10. A plasma etching device comprising: a cylinder having an end wall and an opposing front opening; at least one electrode surrounding said cylinder and connected to a source of radio frequency energy; a perforated enclosing structure of electrically conductive metal within and spaced from the wall of said cylinder, said perforated metal enclosing structure being large enough to contain within it the material to be etched and serving to isolate the material from the glow discharge of the plasma while permitting active species of the plasma to pass to the material to effect etching of the same.

11. In a plasma etching device: a housing having a first region of sufficient size to receive material to be etched and a second region separate from the first region, means for heating the material within the first region, means for introducing gas into the chamber, means for exciting the gas in the second region to produce a plasma of said gas, and means including a perforated member for confining the glow discharge of the plasma to the second region while permitting active species of the plasma to pass from the second region to the first region to effect etching of the material in the first region.

12. The plasma etching device of claim 11 wherein the means for heating the material comprises an infrared source disposed externally of the housing.

13. In a plasma etching system: a housing having at least one wall defining a reaction chamber, a perforated cylinder open at both ends positioned within the chamber for receiving material to be etched therin, means for introducing an etching gas into the chamber, and means for energizing the gas to form a plasma in the region between the cylinder and the housing wall, the perforated cylinder serving to confine the glow discharge of the plasma to said region while permitting active species of the plasma to pass to the interior of the cylinder to effect etching of the material positioned there.

14. The system of claim 13 wherein the housing wall is cylindrical and the perforated cylinder is disposed coaxially of the chamber.

15. In a process for removing photoresist from a wafer, the steps of: dividing a chamber into first and second regions with a perforated member, placing the wafer in the first region, generating an oxygen-containing plasma in the second region, confining the glow discharge of the plasma to the second region with the perforated member, and allowing active species of the plasma to pass through the perforated member to effect removal of the photoresist from the wafer in the first region.

16. The process of claim 15 including the step of heating the wafer.

17. The process of claim 16 wherein the wafer is heated by radiating the wafer with energy from an infrared lamp.

18. In a plasma etching and photoresist removal process, the steps of: dividing a chamber into first and second regions with a perforated member, placing a wafer having photoresist defining a pattern thereon in the first region, generating a plasma of active species in the second region for effecting removal of material not protected by the photoresist from the wafer, confining the glow discharge of the plasma to the second region with the perforated member, allowing the active species to pass through the perforated member to effect removal of the material from the wafer, and thereafter heating the wafer and exposing the wafer to an oxygen-containing plasma in the first region to effect removal of the photoresist from the wafer.

19. The process of claim 18 wherein oxygen for generating the oxygen-containing plasma is evolved during the removal of the material which is not protected by the photoresist.

20. The process of claim 18 including the step of introducing oxygen into the second region for the oxygen-containing plasma.

21. The process of claim 18 wherein the wafer is heated by radiating the wafer with energy from an infrared lamp.

* * * * *